United States Patent [19]

Sakai

[11] Patent Number: 5,043,759

[45] Date of Patent: Aug. 27, 1991

[54] COLOR IMAGE RECORDING APPARATUS WITH LIGHT TRANSMISSIVE FEED BELT

[75] Inventor: Toshio Sakai, Nagoya, Japan

[73] Assignee: Brother Kogyo Kabushiki Kaisha, Aichi, Japan

[21] Appl. No.: 419,527

[22] Filed: Oct. 6, 1989

[30] Foreign Application Priority Data

| Oct. 7, 1988 | [JP] | Japan | 63-132172[U] |
| Oct. 7, 1988 | [JP] | Japan | 63-254447 |
| Oct. 7, 1988 | [JP] | Japan | 63-254448 |
| Oct. 7, 1988 | [JP] | Japan | 63-254449 |
| Oct. 7, 1988 | [JP] | Japan | 63-254450 |

[51] Int. Cl.$^5$ .................................. G03B 27/04
[52] U.S. Cl. ............................... 355/88; 355/27; 355/32; 355/97; 355/326; 361/212; 361/214; 361/234
[58] Field of Search ............ 355/27, 78, 88, 99, 355/97, 326, 327, 104, 113; 361/212, 234, 214, 225, 233

[56] References Cited

U.S. PATENT DOCUMENTS

| 3,658,533 | 4/1972 | Fotland et al. ............... 355/104 X |
| 3,832,053 | 8/1974 | Goel et al. ...................... 361/234 X |
| 3,904,292 | 9/1975 | Ravich ............................ 355/100 |
| 4,353,647 | 10/1982 | Harrell et al. ................. 355/85 |
| 4,363,070 | 12/1982 | Kisler ............................... 361/212 |
| 4,392,738 | 7/1983 | Fujino et al. ................... 355/271 |
| 4,394,089 | 7/1983 | McIntosh et al. .............. 355/88 |
| 4,426,152 | 1/1984 | Sakamoto et al. ............. 355/75 |
| 4,454,559 | 6/1984 | Shenoy ............................ 361/214 |
| 4,494,166 | 1/1985 | Billings et al. ................. 361/214 |
| 4,745,030 | 5/1988 | Arahara et al. ................ 428/421 |
| 4,789,612 | 12/1988 | Haneda et al. ................. 430/42 |
| 4,806,983 | 2/1989 | Satou .............................. 355/129 |
| 4,823,942 | 4/1989 | Martin et al. .................. 361/212 X |
| 4,919,531 | 4/1990 | Mashiko et al. ................ 355/27 |

FOREIGN PATENT DOCUMENTS 0152890 12/1979 Japan ............................ 361/214

Primary Examiner—R. L. Moses
Assistant Examiner—Christopher Horgan
Attorney, Agent, or Firm—Oliff & Berridge

[57] ABSTRACT

A color image recording apparatus includes an exposure device in the housing for exposing a photosensitive recording medium to light through a mask member which has been produced based on image information. A light-transmissive contacting plate for holding the mask member and the photosensitive recording medium closely against each other is disposed in a mask member feed belt and connected to a belt support frame assembly. A positioning unit for positioning the mask member with respect to the photosensitive recording medium comprises a link mechanism for moving the belt support frame assembly. The belt support frame assembly and the housing are operatively connected by the link mechanism. The color image recording apparatus further includes a charging unit for electrically charging at least a surface of the feed belt with which the mask member will be brought into contact. The surface of the feed belt comprises an electrically chargeable, relatively hard coated layer. A discharging unit for removing electrostatic charges from the mask member is disposed near an end of the feed belt for receiving the mask member and positioned in confronting relation to a surface of the feed belt. The color image recording apparatus also includes a resist roller held against the end of the feed belt, at least one sensor for detecting a positioning mark on the mask member, and a guide member for guiding the mask member onto the feed belt.

23 Claims, 5 Drawing Sheets

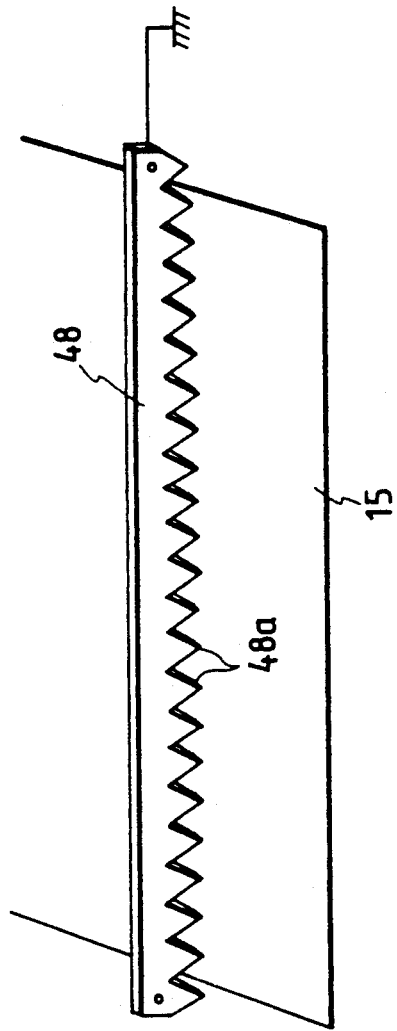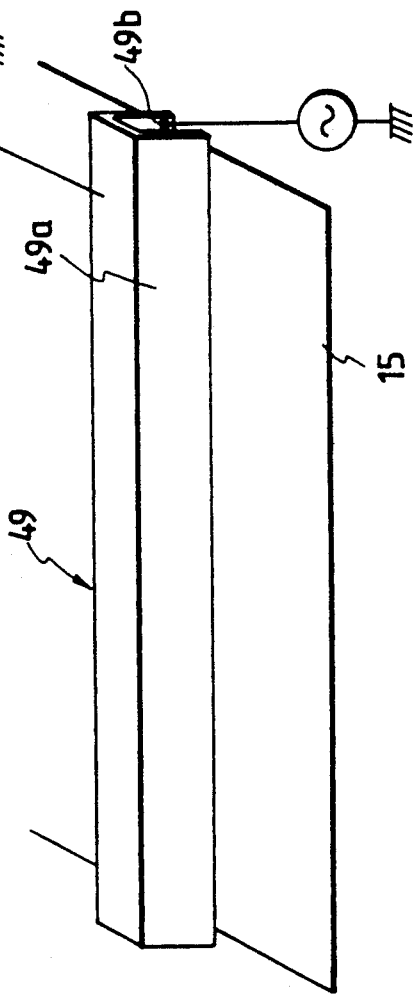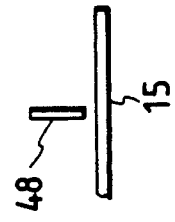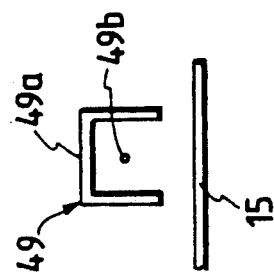

COLOR IMAGE RECORDING APPARATUS WITH LIGHT TRANSMISSIVE FEED BELT

BACKGROUND OF THE INVENTION

The present invention relates to a color image recording apparatus for recording color images by exposure of a photosensitive recording medium to color-separated images through mask members.

There has been proposed a color image recording apparatus with a monochromatic laser beam printer coupled to its upper portion, as disclosed in U.S. patent application Ser. No. 07/255,342 filed on Oct. 11, 1988 by Toshio Sakai et al. The proposed color image recording apparatus records a color image by employing three primary mask members which are produced by the monochromatic laser beam printer.

The color image recording apparatus includes a positioning or registering device having a feed belt in the form of an endless sheet made of PET (polyethylene terephthalate). The feed belt serves to electrostatically attract a mask member, which has been delivered from the monochromatic laser printer, to its lower surface, and feed the attracted mask member. A charging brush for electrostatically charging the feed belt is disposed near the feed belt. A resist roller is held against the lower surface of an upstream end of the feed belt, and a chute for guiding the mask member into a position between the feed belt and the resist roller is positioned upstream of the feed belt and the resist roller. The color image recording apparatus also includes an exposure device disposed above the positioning unit and having red, green, and blue filters. The exposure device is movable along the feed belt for scanning the mask member positioned by the positioning unit. A continuous photosensitive recording medium, which is disposed below the positioning unit, is closely held against the lower surface of the feed belt with the mask member therebetween when the photosensitive recording medium is to be exposed to light passing through the mask member. A pressure developing unit for holding the exposed photosensitive recording medium and a color developer sheet against each other under pressure to develop an image on the color developer sheet is located downstream of the positioning unit.

The color image recording apparatus operates as follows: A mask member produced by and delivered from the monochromatic laser beam printer is fed through the chute into the position between the feed belt and the resist roller, and electrostatically attracted to the lower surface of the feed belt which is electrostatically charged by the charging brush. The photosensitive recording medium is then closely held against the feed belt with the mask member sandwiched therebetween. The exposure device is energized and moved to scan the mask member so that an image carried on the mask member is transferred to the photosensitive recording medium. This process is repeated to transfer images of three primary mask members by successively exposing the photosensitive recording medium to light passing through red, green, and blue filters. A colored latent image is now formed on the photosensitive recording medium. Thereafter, the photosensitive recording medium is fed into the pressure developing unit in which the photosensitive recording medium and a color developer sheet are held against each other under pressure and heated to form a developed colored image on the color developer sheet.

Since the feed belt is resilient, it has been difficult to hold the photosensitive recording medium and each mask member intimately against each other while in contact with the feed belt. For holding the photosensitive recording medium and the mask member more fully, it is necessary to increase the tension of the feed belt. If the tension of the feed belt is to be increased, however, a belt roller for driving the feed belt and a frame which supports the belt roller have to be increased in mechanical strength. Therefore, the belt roller and the frame tend to be heavy and large in size. Moreover, there is a demand for a light-weight feed belt as it needs to be moved for positioning or registering the mask members.

The feed belt of the positioning unit is moved in a horizontal plane by a moving mechanism comprising a rack and a pinion. The moving mechanism includes a guide member for slidingly guiding the rack. The accuracy with which the feed belt is moved is however low because of lost motion or backlash between the rack and the guide member. In order to eliminate the backlash, it is necessary to increase the dimensional accuracy of various components of the positioning unit, and hence the cost of manufacture of the positioning unit will become prohibitively high. Furthermore, the rack and pinion mechanism inherently suffers from backlash between the rack and the pinion, with the result that the feed belt moved with poor accuracy. Any means for eliminating such backlash has been employed in the earlier color image recording apparatus.

Another brush or the like for dusting off the surface of the feed belt is also held in contact with the feed belt. Inasmuch as the feed belt is made of PET and low in hardness, however, the surface of the feed belt is liable to get scratched or otherwise damaged by this brush and the charging brush. If the feed belt is damaged, its transparency is lowered, and the feed belt cannot be used for a long period of time. Since the damaged feed belt is lower in electric insulation, it cannot be sufficiently electrically charged by the charging brush, and hence cannot well attract the mask member.

In the case where the mask member is of low insulation resistance, when the mask member touches the feed belt of the positioning unit, the mask member may be electrically charged by the electrostatically charged feed belt. When the mask member is electrically charged, it is attracted by the chute or other members while it is being delivered into the positioning unit. The mask member may be stopped by the chute or other members to which it is attracted, and therefore may not properly be fed to the feed belt. There has heretofore been not available a suitable means for removing electrostatic charges from the charged mask member.

Each mask member bears a positioning or registering mark printed on its leading end and detectable by a sensor mounted on a sensor support bar that is positioned underneath the positioning unit. The mask member is positioned or registered in place by the positioning unit when the leading end of the mask member is inserted between the feed belt and the sensor support bar and the positioning mark is detected by the sensor. If the leading end of the mask member is curved downwardly due to humidity or the like before it reaches the sensor support bar, then the leading end of the mask member may not properly be inserted between the feed belt and the sensor support bar, and hence the positioning mark may not be detected by the sensor.

SUMMARY OF THE INVENTION

It is an object of the present invention to provide a color image recording apparatus which includes a positioning unit that includes a small and lightweight frame and is capable of holding a photosensitive recording medium and a mask member closely against each other.

Another object of the present invention is to provide a color image recording apparatus which includes a positioning unit that can position or register mask members highly accurately without any appreciable lost motion or backlash.

Still another object of the present invention is to provide a color image recording apparatus which includes a positioning unit comprising a feed belt of increased hardness to guard against scratches or damage on its surface, so that the feed belt can be electrostatically charged sufficiently.

Yet another object of the present invention is to provide a color image recording apparatus which reliably prevents mask members from being electrostatically charged, and which can properly feed mask members to the feed belt of a positioning unit.

Yet still another object of the present invention is to provide a color image recording apparatus which has means for reliably guiding a mask member onto a sensor support bar even when the leading end of the mask member is curved, so that the mask member can properly be positioned or registered in place by a positioning unit.

According to the present invention, there is provided a color image recording apparatus comprising a housing, an exposure device in the housing for exposing a photosensitive recording medium to light through a mask member which has been produced based on image information, a light-transmissive feed belt for carrying and feeding the mask member, a plurality of belt rollers around which the feed belt is trained a belt support frame assembly on which the belt rollers are rotatably supported, the belt support being relatively movably supported by the housing, positioning means for moving the belt rollers and the belt support frame assembly to position the mask member carried on the feed belt in a predetermined position with respect to the photosensitive recording medium, and a light-transmissive contacting plate for holding the mask member and the photosensitive recording medium closely against each other, the contacting plate being disposed in the feed belt and connected to the belt support frame assembly.

According to the present invention, there is also provided a color image recording apparatus comprising a housing, an exposure device in the housing for exposing a photosensitive recording medium to light through a mask member which has been produced based on image information, a light-transmissive feed belt for carrying and feeding the mask member, a plurality of belt rollers around which the feed belt is trained, a belt support frame assembly on which the belt rollers are rotatably supported, the belt support being relatively movably supported by the housing, and positioning means for moving the belt rollers and the belt support frame assembly to position the mask member carried on the feed belt in a predetermined position with respect to the photosensitive recording medium, wherein the positioning means comprises a link mechanism for moving the belt support frame assembly, the belt support frame assembly and the housing being operatively connected by the link mechanism.

According to the present invention, there is further provided a color image recording apparatus comprising a housing, an exposure device in the housing for exposing a photosensitive recording medium to light through a mask member which has been produced based on image information, a light-transmissive feed belt for carrying and feeding the mask member, a positioning unit for positioning the mask member with respect to the photosensitive recording medium, the positioning unit including a light-transmissive feed belt for feeding the mask member, charging means for electrically charging at least a surface of the feed belt with which the mask member will be brought into contact, wherein the surface of the feed belt comprises an electrically chargeable, relatively hard coated layer.

There is also provided in accordance with the present invention a color image recording apparatus comprising a housing, an exposure device in the housing for exposing a photosensitive recording medium to light through a mask member which has been produced based on image information, a feed belt for feeding the mask member to position the mask member with respect to the photosensitive recording medium, and discharging means for removing electrostatic charges from the mask member, the discharging means being disposed near an end of the feed belt for receiving the mask member and positioned in confronting relation to a surface of the feed belt.

Moreover, there is further provided a color image recording apparatus comprising a housing, an exposure device in the housing for exposing a photosensitive recording medium to light through a mask member which has been produced based on image information a feed belt for carrying and feeding the mask member, positioning means for positioning the mask member carried by the feed belt in a predetermined position with respect to the photosensitive recording medium, a resist roller held against an end of the feed belt for receiving the mask member, at least one sensor for detecting a positioning mark on the mask member, and guide means for guiding the mask member onto the feed belt, the guide means being disposed between the resist roller and an area of the feed belt on which the mask member is positioned.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIGS. 9A and 9B are side elevational and perspective views, respectively, of a discharging unit according to yet another embodiment of the present invention; and FIGS. 10A and 10B are side elevational and perspective views, respectively, of a discharging unit according to yet still another embodiment of the present invention.

DETAILED DESCRIPTION OF THE PREFERRED EMBODIMENTS

Figure 1:
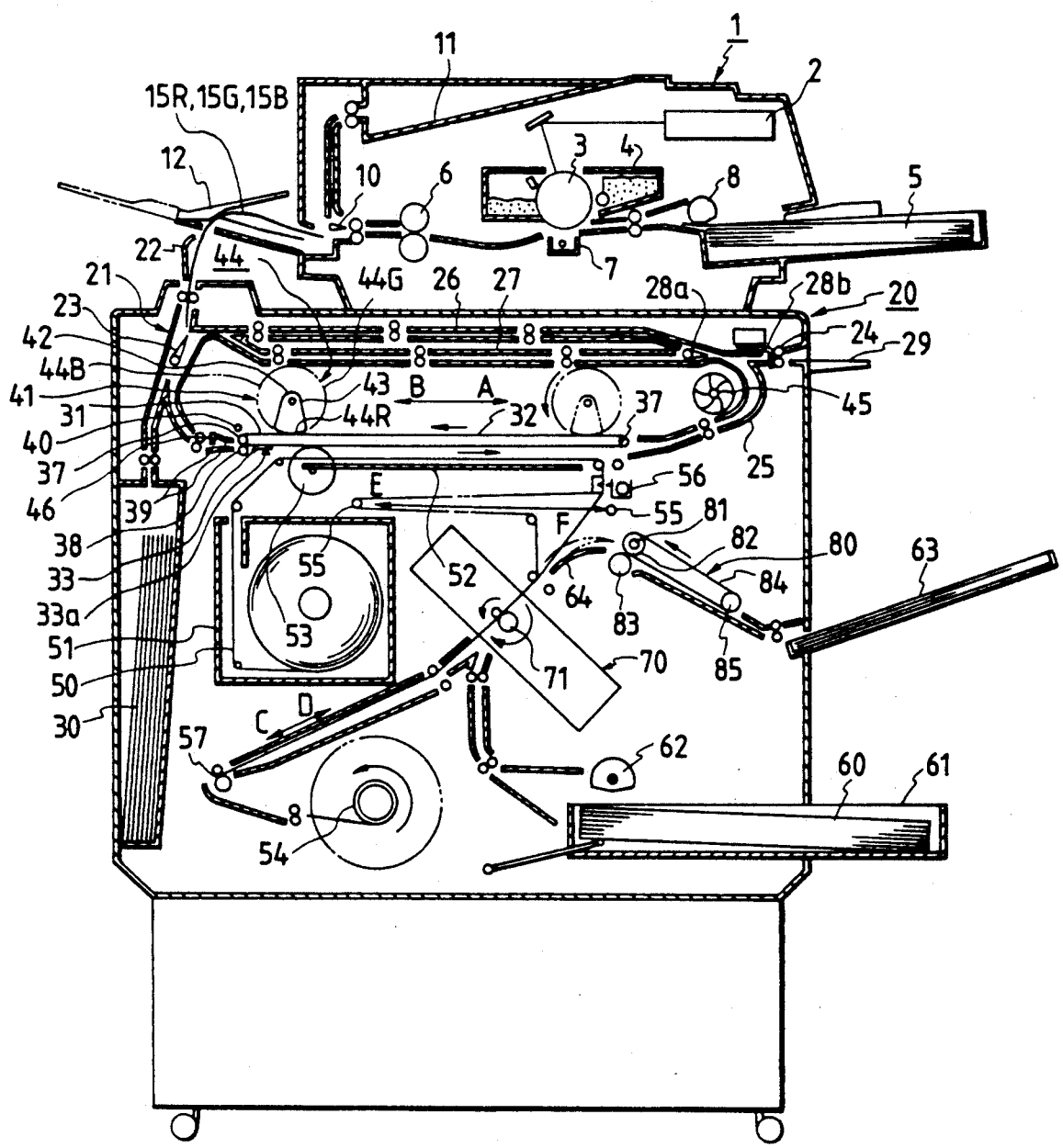
FIG. 1 is a schematic vertical cross-sectional view of a color image recording apparatus according to an embodiment of the present invention, with a monochromatic laser beam printer for producing mask members being mounted on the color image recording apparatus.

Like or corresponding parts are denoted by like or corresponding reference characters throughout views.

The terms "upstream" and "downstream" used herein are employed with reference to the direction in which a mask member, a photosensitive recording medium, and a color developer sheet are normally fed in a color image recording apparatus.

FIG. 1 shows a color image recording apparatus 20 according to an embodiment of the present invention. A monochromatic laser beam printer 1 for producing mask members is coupled to the color image recording apparatus 20.

The laser beam printer 1 is placed on the top of the color image recording apparatus 20. The laser beam printer 1 has a polygon scanner 2 which applies a laser beam to an electrically charged cylindrical photosensitive member 3 to form an electrostatic latent image on its outer circumferential surface. The electrostatic latent image on the photosensitive member 3 is then developed into a visible toner image by a developing unit 4 disposed alongside of the photosensitive member 3. An image transfer unit 7 is positioned below the photosensitive member 3 for transferring the toner image from the photosensitive member 3 onto a sheet of plain paper or an OHP sheet.

A sheet cassette 5 storing a stack of sheets of plain paper of OHP sheets is detachably inserted in the casing of the laser beam printer 1 upstream of the image transfer unit 7. The sheets in the sheet cassette 5 are fed one by one between the photosensitive member 3 and the image transfer unit 7 by a sheet feed roller 8 positioned near the sheet cassette 5. An image fixing unit 6 having a pair of fixing rollers is disposed downstream of the photosensitive member 3, and a sheet path selector 10 is disposed downstream of the image fixing unit 6. A sheet discharge tray 11 is disposed on the upper panel of the laser beam printer 1, whereas another sheet discharge tray 12 is positioned outside of the laser beam printer 1 downstream of its output slot near the sheet path selector 10.

If a black-and-white image is to be reproduced, then the printed sheet from the image fixing unit 6 is discharged by the sheet path selector 10 onto the sheet discharge tray 11. If a colored image is to be reproduced, then the printed sheet from the image fixing unit 6 is first discharged onto the sheet discharge tray 12, and then fed into the color image recording apparatus 20. The distal end of the sheet discharge tray 12 is angularly movable between solid-line and chained-line positions in FIG. 1. When it is in the solid-line position, the printed sheet from the laser beam printer 1 is guided into the color image recording machine 20. A set of three monochromatically printed sheets from the laser beam printer 1 is used as a set of mask members 15R, 15G, 15B (also referred to collectively as a mask member or members 15) in the color image recording apparatus 20.

The monochromatic laser beam printer 1 records image data transmitted from a host computer (not shown) on the sheets.

The construction of the color image recording apparatus 20 will be described below.

The color image recording apparatus 20 has a mask member feeder 21 disposed in an upper portion in an apparatus housing. The mask member feeder 21 comprises a positioning unit 31, a circulation guide 25, and two parallel upper and lower storage trays 26, 27, which are coupled in a circulatory pattern. The junction between the positioning unit 31 and the storage trays 26, 27 is connected to the discharge tray 12 of the monochromatic laser beam printer 1 through a guide member 22 disposed above the color image recording apparatus 20, so that a printed sheet (mask member) from the monochromatic laser beam printer 1 can be introduced into the mask member feeder 21. A cooling fan 45 for cooling the positioning unit 31 and associated parts is positioned immediately inwardly of the circulation guide 25.

The mask member feeder 21 includes a swingable gate 23, positioned between the positioning unit 31 and the storage trays 26, 27, for directing a mask member 15, which has been guided by the guide member 22, toward the positioning unit 31 or a discharge tray 30 positioned in one lower side of the color image recording apparatus 20. A swingable gate 28a is disposed between the circulation guide 25 and the storage trays 26, 27. The gate 28a directs a mask member 15, which has been guided by the circulation guide 25, into the upper storage tray 26 or the lower storage tray 27. A mask member 15 which has manually been inserted from a manual feed tray 29 disposed on an opposite upper side of the color image recording apparatus 20 can be introduced into the mask member feeder 21 through a pair of rollers 24. Another gate 28b is disposed between the manual feed tray 29 and the storage trays 26, 27, for allowing the mask member 15 manually inserted from the manual feed tray 29 to be fed into the mask member feeder 21.

Figure 2:
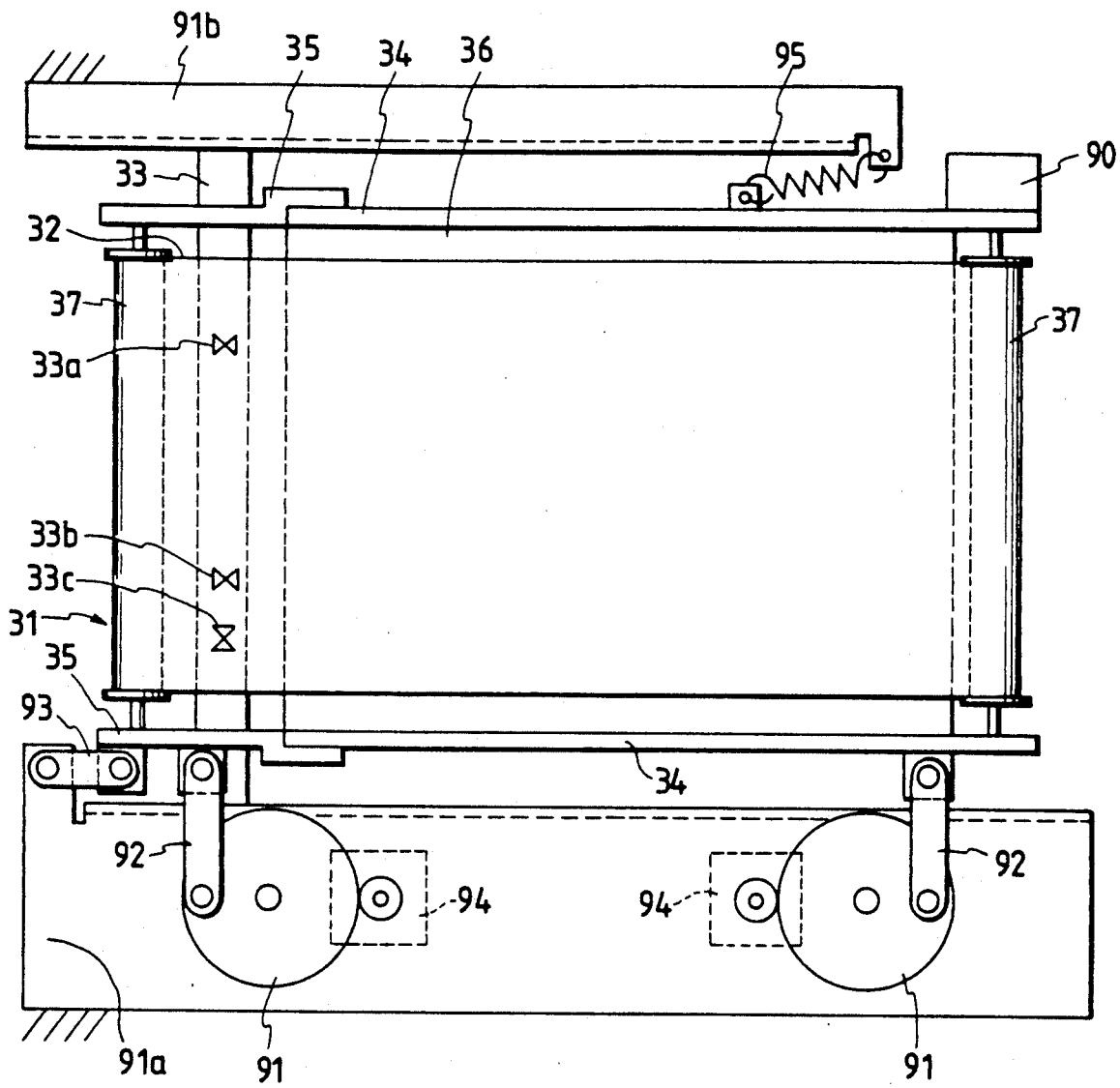
FIG. 2 is an enlarged plan view of a positioning unit in the color image recording apparatus.
Figure 3:
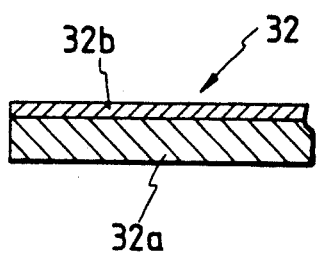
FIG. 3 is an enlarged fragmentary cross sectional view of a feed belt of the positioning unit.

As shown in FIG. 2, the positioning unit 31 comprises an endless feed belt 32 and a pair of belt rollers 37 around which the feed belt 32 is trained. The feed belt 32 is constructed of a web or film 32a (FIG. 3) of a light-transmissive dielectric material such as PET (polyethylene terephthalate) which has high mechanical strength, heat resistance, and dimensional stability and which is coated on one surface with a layer 32b of a ultraviolet-curing acrylic or silicone resin. The film 32a has a thickness ranging from $75\mu$ to $100\mu$, and the coated surface layer 32b has a thickness in the range of from $1\mu$ to $10\mu$. The coated surface of the feed belt 32 has a pencil hardness ranging from H to 4 H. The feed belt 32 is trained around the belt rollers 37 with its coated surface facing outside. The reverse side of the feed belt 32 is coated with a transparent antistatic paint, or an electrically conductive material is evaporated on the reverse side of the feed belt 32, so that the reverse side of the feed belt 32 is rendered antistatic.

An upstream one (on the lefthand side in FIG. 2) of the belt rollers 37 comprises a sleeve of electrically conductive rubber fitted over a metal shaft, whereas the downstream belt roller 37 (on the righthand side in FIG. 2; has a tubular outermost layer of rubber. The belt rollers 37 are rotatably supported at their opposite ends by a pair of parallel belt support frames which comprise a pair of main side frames 34 spaced from each other and a pair of auxiliary side frames 35 spaced from each other and detachably connected contiguously to the main side frames 34. A flat contacting plate 36 made of a transparent acrylic resin, for example, is disposed between and fixed to the main side frames 34. The flat contacting plate 36 is positioned horizontally between the belt rollers 37 and vertically between the upper and lower runs of the feed belt 32. The flat contacting plate 36 may be made of any of other light-transmissive materials than the acrylic resin, for example, a polycarbonate resin. It is more preferable to use a highly antistatic acrylic resin as the material of the flat contacting plate 36 since it makes the flat contacting plate 36 less attractive of dust particles or other foreign matter. Instead of the flat contacting plate 36, a contacting plate having a smoothly downwardly bulging lower central surface may be employed which allows the mask member 15 to be held more closely against the feed belt 32.

A belt feed motor 90 has its output shaft connected to one end of the downstream belt roller 37 for rotating the belt roller about its own axis. When the belt feed motor 90 is energized, therefore, the feed belt 32 is driven in a circulating manner as indicated by the arrows in FIG. 1. One of the main side frames 34 and its associated auxiliary side frame 35 are operatively supported horizontally on an apparatus housing member 91a through a pair of belt support frame moving links 92 and a pair of belt support frame moving discs 91 to which the links 92 are eccentrically coupled. The same auxiliary side frame 35 is also operatively joined to the apparatus housing member 91a through another link 93. A pair of belt support frame moving motors 94 is mounted on the apparatus housing member 91a. The motors 94 have respective output shafts operatively connected to the discs 91, respectively, through intermeshing gear teeth (not shown). Therefore, when the motors 94 are energized, the frames 34, 35 are moved horizontally back and forth through the discs 91 and the links 92. Such horizontal movement of the frames 34, 35 and hence the feed belt 32 is controlled depending on the position of positioning or registering marks on the mask member 15. To the other main side frame 34, there is coupled a spring 95 engaging an apparatus housing member 91b and having its axis inclined with respect to the axes of the links 92, 93. The spring 95 serves to take up any lost motion or gear backlash between the frames 34, 35, the links 92, 93, the discs 91, and the output shafts of the motors 94, so that the feed belt 32 can be positioned highly accurately.

A resist roller 38 (FIG. 1) is held against the lower surface of the upstream end of the feed belt 32, and a chute 39 for guiding the mask member 15 into a position between the upstream belt roller 39 and the resist roller 38 is disposed just upstream of the belt roller 37 and the resist roller 38.

A charging brush 40 comprising an array of electrically conductive fibers is disposed in contact with the upper surface of the upstream end of the feed belt 32. The feed belt 32 can be electrically charged by the charging brush 40 for electrostatically attracting the mask member 15 to the lower surface of the feed belt 32.

Figure 6:
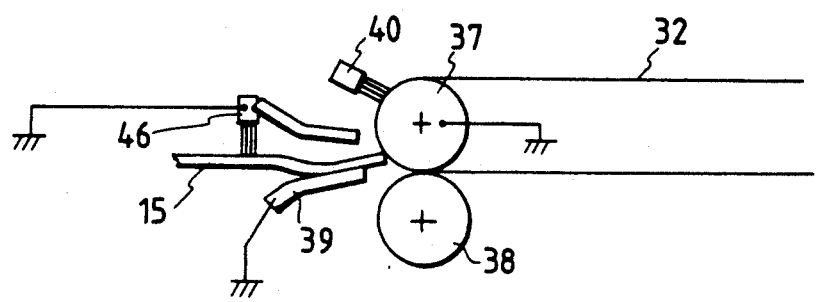
FIG. 6 is an enlarged fragmentary schematic side elevational view showing a discharging unit associated with the positioning unit.

A discharging unit 46 (see FIGS. 1 and 6) for removing electrostatic charges from the mask member 15 is disposed just upstream of the chute 39. Since any unwanted electrostatic charges are removed from the mask member 15 by the discharging unit 46, the mask member 15 can effectively be electrostatically attracted to the feed belt 32 which is electrically charged by the charging brush 40.

Figure 4:
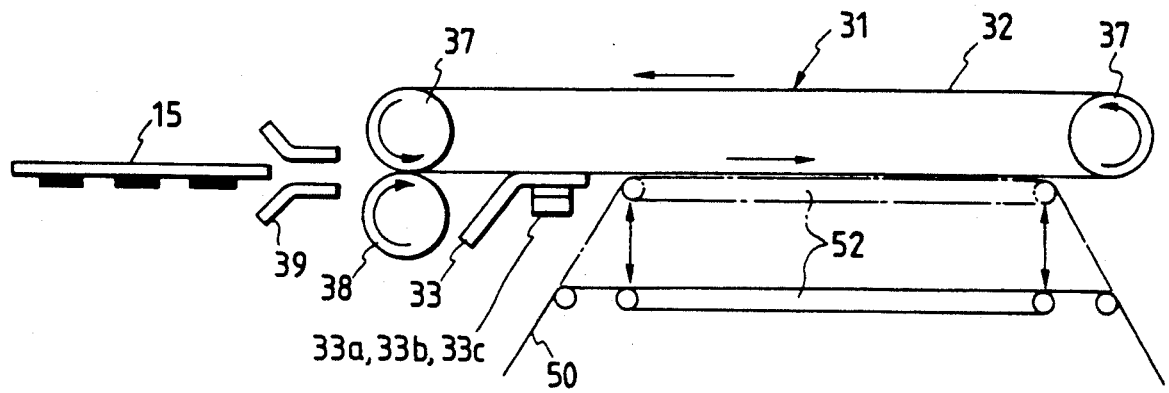
FIG. 4 is an enlarged schematic side elevational view of the positioning unit.
Figure 5:
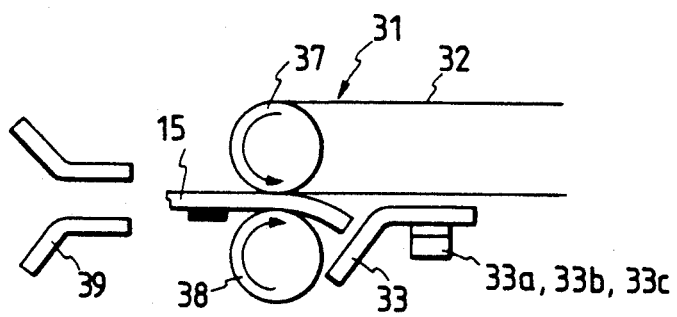
FIG. 5 is an enlarged fragmentary schematic side elevational view of the positioning unit, showing the manner in which a mask member is guided to enter the positioning unit.

A sensor support bar 33 is disposed underneath the feed belt 32 near the resist roller 38 just downstream thereof. The sensor support bar 33 supports a set of sensors 33a, 33b, 33c for detecting positioning or registering marks (not shown) printed on the mask member 15 to position or register the mask member 15. As shown in FIGS. 4 and 5, the sensor support bar 33 has an upstream edge portion extending obliquely downwardly toward the lower peripheral surface of the resist roller 38, and also has a downstream horizontal portion held against the lower run of the feed belt 32. Therefore, the sensor support bar 33 serves to guide the mask member 15, which has been fed past the resist roller 38, into contact with the lower surface of the feed belt 32.

As shown in FIG. 1, an exposure device 41 is disposed above the positioning unit 31. The exposure device 41 extends transversely across the positioning unit 31, i.e., in a direction normal to the sheet or FIG. 1, and is reciprocally movable horizontally along the positioning unit 31 as indicated by the arrows A, B.

The exposure device 41 comprises a linear light source or lamp 42 for emitting white light, a reflecting member 43 disposed over and extending downwardly from the light source 42 for reflecting light from the light source 42 in downwardly, and a cylindrical color separation filter assembly 44 comprising three color separation filters 44R, 44G, 44B of red, green, blue disposed around the light source 42 and the reflecting member 43.

A flat exposure table 52 which lies horizontally is disposed beneath the positioning unit 31. The flat exposure table 52 can be moved upwardly and downwardly by a cam 53 which is actuatable by an actuator (not shown).

A photosensitive recording medium or sheet 50 is primarily made of photosetting resins including a photopolymerization initiator known from Japanese Laid-Open Patent Publication No. 62(1987)-143044, for example. More specifically, the photosensitive recording medium 50 comprises a base sheet coated with photosetting resins which will be set upon exposure to lights having wavelengths of red, green, and blue, and microcapsules containing dye precursors of cyan, magenta, and yellow. The photosensitive recording medium 50 is housed in the form of a roll in a cartridge 51 in a light-shielded condition, the cartridge 51 being disposed below and upstream of the positioning unit 31. A pressure developing unit 70 having a pair of pressure rollers 71 is positioned below the exposure table 52. Between the exposure table 52 and the pressure developing unit 70, there are disposed a fastening roller 56 for gripping the photosensitive recording medium 50 while an image thereon is being developed by the pressure developing unit 70, a tension roller 55 for tensioning the photosensitive recording medium 50 to remove a sag therefrom while an image thereon is being developed by the pressure developing unit 70, and a movable guide 64. A takeup roller 54 for winding up the photosensitive recording medium 50 is located below the pressure developing unit 70. A drive roller 57 for feeding the photosensitive recording medium 50 at a constant speed is positioned between the pressure developing unit 70 and the takeup roller 54 along the path of the photosensitive recording medium 50. The photosensitive recording medium 50 which is drawn out of the cartridge 51 passes between the feed belt 32 and the exposure table 52, goes past the fastening roller 56, the tension roller 55, the movable guide 64, the pressure developing unit 70, and the drive roller 57, and is wound around the takeup roller 54.

A color developer sheet 60 comprises a base sheet coated with a color developer disclosed in Japanese Laid-Open Patent Publication No. 58(1983)-88739, for example. A stack of such color developer sheets 60 is stored in a cassette 61 with their coated surfaces facing downwardly, the cassette 61 being disposed in a lower portion of the color image recording apparatus 20. The color developer sheets 60 are fed, one by one, from the cassette 61 by a feed roller 62 which is intermittently operated by an actuator (not shown), and supplied to the pressure developing unit 70. The supplied color developer sheet 60 is placed over the exposed area of the photosensitive recording medium 50, and pressed thereagainst by the pressure rollers 71 in the pressure developing unit 70, whereupon a latent image which has been formed on the photosensitive recording medium 50 by exposure to light from the exposure device 41 is visualized on the color developer sheet 60.

A thermally fixing unit 80 which is positioned upwardly of the cassette 61 comprises a heat roller 82 with a heater 81 disposed therein, an auxiliary roller 85, an endless belt 84 trained around the heat roller 82 and the auxiliary roller 85, and a pinch roller 83 pressed against the heat roller 82 through the endless belt 84 therebetween. The color developer sheet 60 which has been fed from the pressure developing unit 70 and guided by the movable guide 64 is introduced into the thermally fixing unit 80 in which the color developer sheet 60 is calendered to fix the visualized image. The color developer sheet 60 is then discharged from the thermally fixing unit 80 onto a discharge tray 63 disposed downstream of the thermally fixing unit 80 and positioned outside of the housing of the color image recording apparatus 20 below the manual feed tray 29.

The color image recording apparatus 20 thus constructed operates as follows:

It is assumed that a red mask member 15R is produced by the monochromatic laser beam printer 15. More specifically, an electrostatic latent image is formed on the surface of the photosensitive member 3 by the polygon scanner 2 based on desired data to be recorded or printed, and then toner particles are applied to the latent image by the developing unit 4, thus visualizing the latent image into a toner image as a light-shielding image. A sheet is fed from the cassette 5 toward the photosensitive member 3 by the feed roller 8, and the light-shielding toner image on the photosensitive member 3 is transferred onto the sheet from the cassette 5 by the image transfer unit 7. Then, the sheet is fed to the image fixing unit 6 in which the toner image is fixed to the, sheet with heat by fixing rollers. The sheet is thereafter discharged as the red mask member 15R onto the discharge tray 12 by the sheet path selector 10. The red mask member 15R thus produced carries the light-shielding toner image except which light can pass through the red mask member 15R to photoset those microcapsules which contain a dye precursor of cyan on the photosensitive recording medium 50.

At this time, the discharge tray 12 of the monochromatic laser beam printer 1 is in the solid-line position. The produced mask member 15R is guided by the guide member 22 into the mask member feeder 21 in the color image recording apparatus 20.

If it is confirmed by the sensors 33a, 33b, 33c in the positioning unit 31 that there is no other mask member present in the positioning unit 31, then the mask member 15R is guided by the gate 23 so that it is fed into the positioning unit 31.

If there is another mask member 15 present in the positioning unit 31 and it is in the process of being exposed to light from the lamp 42, then the mask member 15R is guided by the gate 23 into the discharge tray 30.

It is now assumed that there is no other mask member 15 present in the positioning unit 31. Then, the feed belt 32 is electrically charged by the charging brush 40. While any unwanted electrostatic charges are being removed from the mask member 15R by the discharging unit 46, the mask member 15R is fed into the positioning unit 31. The mask member 15R is guided by the sensor support bar 33 so that it is electrostatically attracted to the lower surface of the feed belt 32. Then, the feed belt 32 is driven by the drive motor 90 to move the mask member 15R to a predetermined exposure position, after which the positioning marks on the mask member 15R are read by the sensors 33a, 33b, 33c and the positioning unit 31 is actuated to move the mask member 15R into an exact position. The mask member 15R also bears a color identification mark (not shown) which indicates the color of the image on the mask member 15R. The color identification mark is read by a sensor (not shown) at the same time that the mask member 15R is positioned by the positioning unit 31 as described above. The cylindrical color separation filter assembly 44 includes sensors (not shown) for detecting the color separation filters 44R, 44G, 44B, respectively. If the color identification mark on the mask member 15R does not correspond to the color separation filter which is now used by the exposure device 41, then the color separation filter assembly 44 is angularly moved until the red color filter 44R is positioned directly below the exposure device 41.

Then, the photosensitive recording medium 50 is gripped and fastened by the fastening roller 56, and the cam 53 is rotated by an actuator (not shown) to elevate the exposure table 52. The photosensitive recording medium 50 is now held intimately against the feed belt 32 of the positioning unit 31 with the mask member 15R sandwiched therebetween.

When the photosensitive recording medium 50 is in close contact with the feed belt 32, the lamp 42 is turned on, and red light is applied from the red filter 44R through the mask member 15R to the photosensitive recording medium 50 while at the same time it is being scanned by the exposure device 41 in the direction indicated by the arrow A. The light from the lamp 42 passes through the red filter 44R and is applied through the mask member 15R to the photosensitive recording medium 50 to expose the same, thus forming a latent image corresponding to the red mask member 15R on the photosensitive recording medium 50. After the exposure, the lamp 42 is de-energized, and the exposure device 41 moves back in the direction indicated by the arrow B. When the exposure device 41 moves back, the color separation filter assembly 44 is rotated by an actuator (not shown) to position the next green filter 44G below the lamp 42. While the exposure device 41 is moving back, the exposure table 52 is lowered by the cam 53 so that the photosensitive recording medium 50 is spaced downwardly from the positioning unit 31 and the mask member 15R.

At this time, the photosensitive recording medium 50 is held under back tension by the shaft in its roll in the cartridge 51. When the exposure table 52 is lifted, the length of the photosensitive recording medium 50 which corresponds to the upward displacement of the exposure table 52 is drawn out of the cartridge 51. When the exposure table 52 is lowered after exposure, the length of the photosensitive recording medium 50 which corresponds to the downward displacement of the exposure table 52 is withdrawn into the cartridge 51, thereby taking up any sag in the photosensitive recording medium 50.

After the exposure using the red mask member 15R is completed and the descent of the exposure table 52 is confirmed, the feed belt 32 of the positioning unit 31 is moved to deliver the mask member 15R into the circulation guide 25, from which the red mask member 15R is guided by the gate 28 into the upper storage tray 26.

Then, the green mask member 15G generated by the monochromatic laser beam printer 1 passes through the guide 22, and is guided by the gate 23 into the positioning unit 31 in which the green mask member 15G is electrostatically attracted to the lower surface of the feed belt 32, fed to the exposure position, and positioned with respect to the photosensitive recording medium 50. The photosensitive recording medium 50 is fastened by the fastening roller 56, and the exposure table 52 is elevated to hold the photosensitive recording medium 50 and the green mask member 15G closely against the feed belt 32, after which the lamp 42 is energized to expose the photosensitive recording medium 50 to green light from the green filter 44G, thus forming a latent image corresponding to the green mask member 15G on the photosensitive recording medium 50.

Then, the color separation filter assembly 44 is rotated to bring the blue filter 44B below the lamp 42. The blue mask member 15B generated by the monochromatic laser beam printer 1 is then delivered by the mask member feeder 21 and positioned by the positioning unit 31. Thereafter, the photosensitive recording medium 50 is exposed to blue light by the exposure device 41, thereby forming a latent image corresponding to the blue mask member 15B on the photosensitive recording medium 50. Through the above process, a desired colored latent image is formed on the photosensitive recording medium 50.

Then, the exposure table 52 is lowered and the fastening roller 56 is released from the photosensitive recording medium 50, which is then fed by the drive roller 57 in the direction indicated by the arrow C. At this time, the tension roller 55 and the movable guide 64 are in the solid-line position. The pressure rollers 71 of the pressure developing unit 70 are spaced from each other. Therefore, while the photosensitive recording medium 50 is being fed and wound up by the takeup roller 54, the microcapsules on the photosensitive recording medium 50 are not damaged or ruptured by contact with these components. The drive roller 57 is stopped when the trailing end of the latent image on the photosensitive recording medium 50 arrives at the pressure rollers 71 of the pressure developing unit 70.

In synchronism with the winding of the photosensitive recording medium 50, a color developer sheet 60 is delivered from the cassette 61 by the sheet feed roller 62. The color developer sheet 60 from the cassette 61 is stopped when its leading edge faces the trailing end of the latent image on the photosensitive recording medium 50.

The pressure rollers 71 of the pressure developing unit 70 are then rotated and held against each other by an actuator (not shown), and the photosensitive recording medium 50 is gripped and fastened by the fastening roller 56. The photosensitive recording medium 50 and the color developer sheet 60 which are held in superposed relation to each other are pressed and fed in the direction indicated by the arrow D. At this time, those microcapsules which are not photoset on the photosensitive recording medium 50 are ruptured under pressure, and a colored visible image corresponding to the latent image on the photosensitive recording medium 50 is developed on the color developer sheet 60.

As the pressure rollers 71 rotate in the directions indicated by the arrows, the tension roller 50 is moved in the direction indicated by the arrow E, taking up any sag in the photosensitive recording medium 50. While the tension roller 55 moves in the direction indicated by the arrow E, the movable guide 64 is moved by a mechanism (not shown) into the chained-line position to separate the leading edge of the color developer sheet 60 from the photosensitive recording medium 50, and guide the color developer sheet 60 toward the thermally fixing unit 80.

In the thermally fixed unit 80, the color developer sheet 60 inserted between the heat roller 82 which is heated by the heater 81 and the pinch roller 83, and heat energy is applied to the color developer sheet 60 by the heater 81 through the rotating heat roller 82 and the endless belt 84 to promote color development of the colored image. At the same time, a binder polymer by which the color developers are fixed to the base sheet of the color developer sheet 60 is thermally fused on the color developer sheet 60 for thereby securing the color developers to the base sheet. The color developer sheet 60 is now calendered to the same smoothness as that of the surface of the endless belt 84, so that the color developer sheet 60 has a suitable glossy surface.

After the color developing and calendering process, the color developer sheet 60 is separated from the endless belt 84, and discharged onto the discharge tray 63.

During the image developing process and the color developing and calendering process described above, the photosensitive recording medium 50 is gripped and fastened in place by the fastening roller 56. Therefore, the portion of the photosensitive recording medium 50 which is placed on and upstream of the exposure table 52 is not affected by changes in the tension of the photosensitive recording medium 50 downstream of the exposure table 52. Consequently, while one image on the photosensitive recording medium 50 is being developed, the photosensitive recording medium on the exposure table 52 may be exposed to light to form another colored latent image thereon.

When it is desired to reproduce a plurality of colored images from the same set of mask members 15, the gage 23 in the mask member feeder 21 is angularly shifted to guide the mask member 15R stored in the storage tray 26 into the positioning unit 31 again, and the photosensitive recording medium 50 is exposed to light through the mask member 15R. The mask members 15G, 15B are similarly guided from the storage trays 26, 27 successively into the positioning unit 31 as soon as the exposure cycle using the previous mask member 15 is finished. The mask member feeder 21 can thus repeatedly circulate the mask members 15 as many times as desired.

After a desired number of colored images have been reproduced from the same set of mask members 15, the gate 23 is further angularly shifted to discharge the mask members 15 from the mask member feeder 21 into the discharge tray 30.

If a mask member 15 of a next set happens to be fed from the monochromatic laser beam printer 1 while a series of colored images are being reproduced in the color image recording apparatus 20, then the gate 23 is angularly moved for thereby guiding the mask member 15 from the monochromatic laser beam printer 1 into the discharge tray 30.

As described above, the mask member feeder 21 is associated with the manual feed tray 29 for allowing a mask member 15, which has been produced by another means, to be manually introduced into the color image recording apparatus 20. The manual feed gate 28b serves to prevent a mask member from being manually inserted in the event that there has already been another mask member in the mask member feeder 21.

Figure 7B:
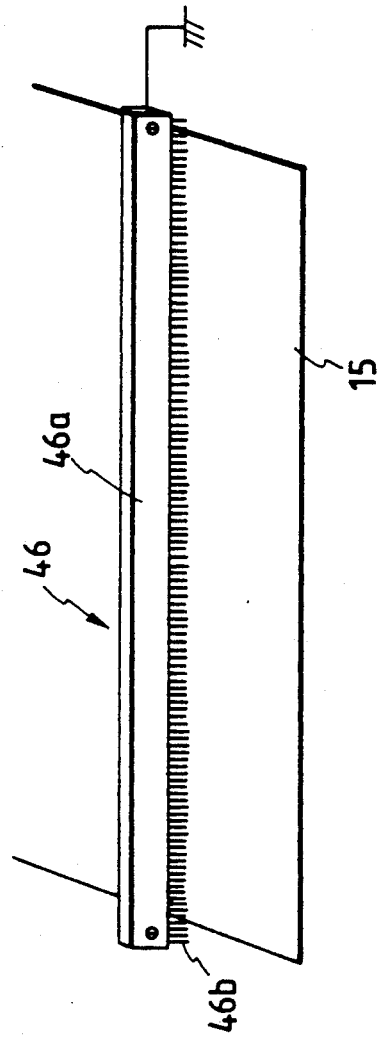
FIGS. 7A and 7B are side elevational and perspective views, respectively, of a discharging unit shown in FIG. 6.
Figure 7A:
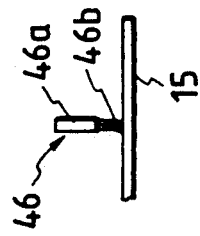

FIGS. 7A and 7B show the discharging unit 46 in detail. The discharging unit 46 comprises a metal base bar 46a extending transversely across the chute 39 and connected to ground, and a brush 46b attached to the lower surface of the base bar 46a and comprising an array of fibers made of either a resin with carbon powder mixed or metal, each of the brush fibers having a length ranging from 4 mm to 5 mm. The brush 46b extends downwardly so that its lower end will be brought into contact with the upper surface of the mask member 15 as it is introduced into the chute 39.

Figure 8B:
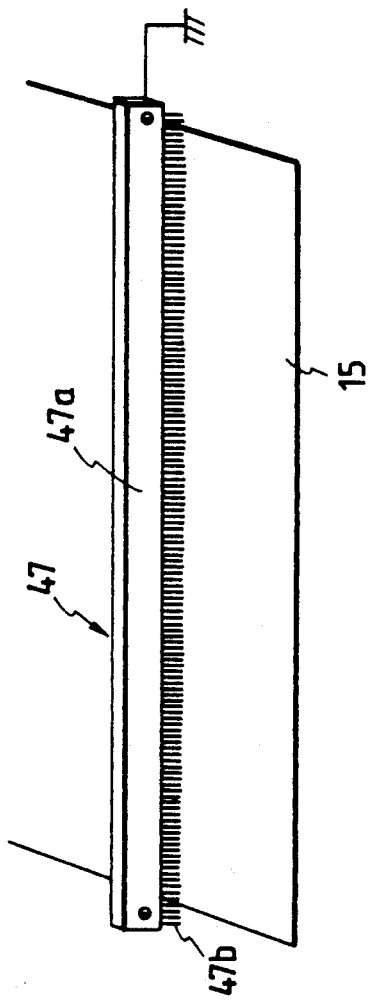
FIGS. 8A and 8B are side elevational and perspective views, respectively, of a discharging unit according to another embodiment of the present invention.
Figure 8A:
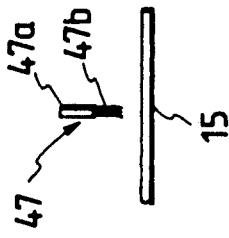

FIGS. 8A and 8B illustrate a discharging unit 47 according to another embodiment of the present invention. The discharging unit 47 comprises a metal base bar 47a and a brush 47b which are identical to the base bar 46a and the brush 46b shown in FIGS. 7A and 7B. The brush 47b is spaced from the mask member 15 by a distance of 3 mm or less.

According to yet another embodiment of the present invention, a discharging unit 48 shown in FIGS. 9A and 9B is in the form of a thin elongate metal plate extending transversely across the chute 39 and grounded, the metal plate having a thickness of about 0.1 mm. The discharging unit 48 has an array of sawteeth 48a along its lower edge and the tip ends of the sawteeth 48a are spaced from the upper surface of the mask member 15 by a distance ranging from 1 mm to 2 mm.

FIGS. 10A and 10B illustrate a discharging unit 49 in accordance with yet still another embodiment of the present invention. The discharge unit 49 comprises a channel-shaped grounded metal shield 49a and a tungsten wire 49b extending in an parallel to the shield 49a, the tungsten wire 49b being of a diameter of about 50μ. The shield 49a is positioned such that the open side thereof faces the mask member 15 and the edges defined in the open side of the shield 49a are spaced about 2 mm to 4 mm from the upper surface of the mask member 15. A high AC voltage of about 6 kV is applied to the wire 49b to generate an electric discharge in the shield 49a to remove electrostatic charges from the mask member 15.

In the illustrated embodiment of the color image recording apparatus 20, the contacting plate 36 which is coupled to the side frames 34 and disposed in the feed belt 32 is effective to hold the mask member 15 and the photosensitive recording medium 50 closely against each other, and the feed belt 32 itself does not support the mask member 15. Therefore, the feed belt 32 is not required to be highly tensioned, and as a result the side frames 34, 35 are not required to be increased in mechanical strength. Accordingly, the positioning device 31 may be lightweight and small in size. The side frames 34, 35 are of increased mechanical strength as they are interconnected by the contacting plate 36.

The links 92, 93 and the discs 91 jointly constitute a link mechanism serving as a mechanism for moving the feed belt 32. Such a link mechanism is subjected to less lost motion or backlash than a rack and pinion mechanism which might otherwise be used to move the feed belt 32. Moreover, the spring 95 serves to take up any undesirable lost motion or backlash which the links 92, 93 and the discs 91 would otherwise suffer, so that the feed belt 32 can be positioned highly accurately.

The coated surface of the feed belt 32 has a pencil hardness ranging from H to 4 H so as to guard against scratches or damage which would otherwise be caused by contact with the charging brush 40 or other foreign matter. Therefore, the ability of the feed belt to transmit light therethrough is not lowered. Since the coated surface of the feed belt 32 is not scratched or damaged, its electric insulation remains high, and it can be electrically charged sufficiently, so that the feed belt 32 can electrostatically attract the mask member 15 reliably, and hence can feed the mask member 15 without fail.

The discharging unit 46 is disposed upstream of the positioning unit 31 for removing unwanted electrostatic charges from the mask member 15. Therefore, the mask member 15 as it enters the positioning unit 31 is electrostatically discharged and hence prevented from being electrostatically attracted to the chute 39 or other neighboring members. the mask member 15 can thus be properly fed into the positioning unit 31 and moved by the feed belt 32.

The sensor support bar 33 is positioned at an upstream portion of the feed belt 32 so that the leading end of the mask member 15 can be guided by the sensor support bar 33 immediately after the mask member 15 has moved past the resist roller 38. Therefore, even if the leading end of the mask member 15 is curved, it is reliably guided by the sensor support bar 33, and hence the positioning or registering marks on the mask member 15 can reliably be detected by the sensors 33a, 33b, 33c supported on the sensor support bar 33. Since the sensor support bar 33 is positioned upstream of the exposure table 52 and the photosensitive recording medium 50, the downwardly inclined upstream edge portion of the sensor support bar 33 may be long enough to catch the leading end of the mask member 15, but any movement of the photosensitive recording medium 50 into and out of contact with the mask member 15 will not be disturbed by the sensor support bar 33.

Although certain preferred embodiments have been shown and described, it should be understood that many changes and modifications may be made therein without departing from the scope of the appended claims.

What is claimed is:

1. A color image recording apparatus comprising:
a housing;
an exposure device in said housing for exposing a photosensitive recording medium to light through a mask member which has been produced based on image information;

a light-transmissive feed belt for carrying and feeding the mask member;

a plurality of belt rollers around which said feed belt is trained;

a belt support frame assembly on which said belt rollers are rotatably supported, said belt support being relatively movably supported by said housing;

positioning means for moving said belt rollers and said belt support frame assembly to position the mask member carried on said feed belt in a predetermined position with respect to the photosensitive recording medium; and a light-transmissive contacting plate and an exposure table for holding therebetween the mask member and the photosensitive recording medium closely against each other, said contacting plate being disposed in said feed belt and connected to said belt support frame assembly.

2. A color image recording apparatus according to claim 1, wherein said contacting plate is made of an acrylic resin.

3. A color image recording apparatus according to claim 1, wherein said contacting plate is made of a polycarbonate resin.

4. A color image recording apparatus according to claim 1, wherein said positioning means comprises a link mechanism for moving said belt support frame assembly, said belt support frame assembly and said housing being operatively connected by said link mechanism.

5. A color image recording apparatus according to claim 4, wherein said link mechanism comprises a pair of discs rotatably supported on said housing, a pair of links having ends operatively coupled to said belt support frame assembly and opposite ends operatively coupled eccentrically to said discs, and a pair of motors on said housing for rotating said discs, respectively.

6. A color image recording apparatus according to claim 5, wherein said link mechanism further includes another link operatively coupled between said belt support frame assembly and said housing.

7. A color image recording apparatus according to claim 4, wherein said positioning means further comprises a spring connected between said belt support frame assembly and said housing, for normally urging said belt support frame assembly in a direction extending obliquely to directions in which said belt support frame member is movable.

8. A color image recording apparatus according to claim 1 further comprising:

charging means for electrically charging at least a surface of said feed belt with which the mask member will be brought into contact, wherein said surface of said feed belt comprises an electrically chargeable, relatively hard coated layer.

9. A color image recording apparatus according to claim 8, wherein said coated layer is made of a hardening resin.

10. A color image recording apparatus according to claim 9, wherein said hardening resin comprises an ultraviolet-curing resin.

11. A color image recording apparatus according to claim 10, wherein said ultraviolet-curing resin is selected from the group consisting of an acrylic resin and a silicone resin.

12. A color image recording apparatus according to claim 10, wherein said ultraviolet-curing resin has a thickness ranging from $1\mu$ to $10\mu$.

13. A color image recording apparatus according to claim 8, wherein said coated layer has a pencil hardness ranging from H to 4 H.

14. A color image recording apparatus according to claim 8, wherein said feed belt comprises a film of polyethylene terephthalate on which said coated layer is disposed.

15. A color image recording apparatus according to claim 14, wherein said film has a thickness ranging from $75\mu$ to $100\mu$.

16. A color image recording apparatus according to claim 1, further comprising:

discharging means for removing electrostatic charges from the mask member, said discharging means being disposed near an end of said feed belt for receiving the mask member and positioned in confronting relation to a surface of said feed belt.

17. A color image recording apparatus according to claim 16, wherein said discharging means comprises a grounded base and a brush mounted on said base and held in contact with the mask member when the mask member is delivered onto said feed belt through said one end thereof.

18. A color image recording apparatus according to claim 16, wherein said discharging means comprises a grounded base and a brush mounted on said base and held out of contact with the mask member when the mask member is delivered onto said feed belt through said one end thereof.

19. A color image recording apparatus according to claim 16, wherein said discharging means comprises a grounded base having an array of sawteeth directed toward the mask member.

20. A color image recording apparatus according to claim 16, wherein said discharging means comprises a grounded channel-shaped shield, a wire extending in said shield, and a power supply for applying an AC voltage to said wire.

21. A color image recording apparatus according to claim 1 further comprising:

a resist roller held against an end of said feed belt for receiving the mask member;

at least one sensor for detecting a positioning mark on the mask member; and guide means for guiding the mask member onto said feed belt, said guide means being disposed between said resist roller and an area of said feed belt on which the mask member is positioned.

22. A color image recording apparatus according to claim 21, wherein said guide means comprises a sensor support bar disposed underneath said feed belt, said sensor being supported on said sensor support bar.

23. A color image recording apparatus according to claim 22, wherein said sensor support bar includes an edge portion extending obliquely away from said feed belt toward a lower end of said resist roller.

* * * * *